(12) United States Patent
Nakagaki

(10) Patent No.: US 11,486,903 B2
(45) Date of Patent: Nov. 1, 2022

(54) VENTILATION DEVICE

(71) Applicant: Panasonic Intellectual Property Management Co., Ltd., Osaka (JP)

(72) Inventor: Tomoya Nakagaki, Aichi (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 17/633,134

(22) PCT Filed: Aug. 25, 2020

(86) PCT No.: PCT/JP2020/031931
§ 371 (c)(1),
(2) Date: Feb. 4, 2022

(87) PCT Pub. No.: WO2021/039753
PCT Pub. Date: Mar. 4, 2021

(65) Prior Publication Data
US 2022/0268811 A1    Aug. 25, 2022

(30) Foreign Application Priority Data
Aug. 28, 2019  (JP) .............................. JP2019-155130

(51) Int. Cl.
*F04D 27/00* (2006.01)
*G01R 15/09* (2006.01)
(Continued)

(52) U.S. Cl.
CPC .............. *G01R 15/09* (2013.01); *F04D 25/06* (2013.01); *F04D 27/00* (2013.01); *F04D 27/001* (2013.01);
(Continued)

(58) Field of Classification Search
CPC .............. G01R 15/04; H02P 6/04; H02P 6/16; F16H 7/02; F04D 27/004
See application file for complete search history.

(56) References Cited

U.S. PATENT DOCUMENTS 6,255,842 B1      7/2001  Hashimoto
2004/0239278 A1*  12/2004 Kobayashi ............... H02P 6/04
                                                                 318/599
(Continued)

FOREIGN PATENT DOCUMENTS

JP   S63-190974 U   12/1988
JP   H06-245589 A    9/1994
(Continued)

OTHER PUBLICATIONS

International Search Report for corresponding Application No. PCT/JP2020/031931, dated Sep. 29, 2020.
Decision to Grant a Patent, drafted Feb. 5, 2021, dated Feb. 16, 2021, in corresponding Japanese Patent Application No. 2020-557351 filed on Aug. 25, 2020.

*Primary Examiner* — Cortez M Cook
(74) *Attorney, Agent, or Firm* — Renner, Otto, Boisselle & Sklar, LLP

(57) ABSTRACT

Controlling a switching element in accordance with a voltage output from a signal amplifying circuit enables adjusting a voltage to be received by a current calculation circuit. Even when a range of a air volume to be used is wide and a range of output of a DC motor is wide, or a current flowing through the DC motor has a wide range, a resistance value of a shunt resistor and an amplification factor of a signal amplifying circuit are not required to be reduced, and thus current detection accuracy of the DC motor can be improved.

16 Claims, 5 Drawing Sheets

(51) Int. Cl.
*F04D 25/06* (2006.01)
*G01R 15/04* (2006.01)
*H02P 6/16* (2016.01)
*F24F 110/30* (2018.01)
*F24F 7/013* (2006.01)

(52) U.S. Cl.
CPC .............. *G01R 15/04* (2013.01); *H02P 6/16* (2013.01); *F24F 7/013* (2013.01); *F24F 2110/30* (2018.01)

(56) References Cited

U.S. PATENT DOCUMENTS

| | | | |
|---|---|---|---|
| 2012/0048520 A1 | 3/2012 | Ikeda | |
| 2012/0286715 A1 | 11/2012 | Nakajima | |
| 2015/0268614 A1* | 9/2015 | Kiyama | ................ F16H 7/02 399/167 |
| 2016/0131142 A1* | 5/2016 | Nakajima | ............. F04D 27/004 417/42 |

FOREIGN PATENT DOCUMENTS

| | | |
|---|---|---|
| JP | 2006-064596 A | 3/2006 |
| JP | 2010-216797 A | 9/2010 |
| JP | 2010-249751 A | 11/2010 |
| JP | 2015-073361 A | 4/2015 |
| WO | 1999/028756 A1 | 6/1999 |
| WO | 2014/208095 A1 | 12/2014 |

* cited by examiner

VENTILATION DEVICE

TECHNICAL FIELD

The present invention relates to a ventilation device.

BACKGROUND ART

In recent years, DC motors typified by brushless DC motors have been increasingly mounted on ventilation devices such as ceiling-embedded ventilation fans because of their high efficiency, or their excellent power saving performance. This kind of ventilation device calculates a air volume of a blade based on a current flowing through a DC motor and a rotation speed of the blade attached to the DC motor, and an output of the DC motor is controlled in accordance with the air volume calculated. Improvement in control accuracy of the DC motor requires improvement in calculation accuracy of the air volume of the blade. For this improvement, improvement in detection accuracy of the current flowing through the DC motor is required.

For example, PTL 1 proposes a technique for detecting a current from an inverter, in which current detection circuit 101 averages an output voltage of operational amplifier 103 and inputs the averaged voltage to microcomputer 105. This current detection circuit 101 includes shunt resistor 102 connected in series to a current path of an inverter, operational amplifier 103 that amplifies and outputs a voltage across shunt resistor 102, and averaging circuit 104 that averages an output of operational amplifier 103. Then, when the voltage across shunt resistor 102 is amplified by operational amplifier 103 for a pulsed current flowing through the inverter and is input to microcomputer 105, an output voltage of operational amplifier 103 is averaged using averaging circuit 104, and thus adjusting a voltage output from operational amplifier 103 to a voltage that can be received by microcomputer 105.

As described above, current detection circuit 101 of PTL 1 enables inputting even the output voltage of operational amplifier 103 having a peak value exceeding the voltage that can be received by microcomputer 105 to the microcomputer 105 for the pulsed current flowing through the inverter by using averaging circuit 104. As a result, even when the current flowing through the inverter is large, an amplification factor of operational amplifier 103 can be increased to enable improvement in accuracy of current detection.

CITATION LIST

Patent Literature

PTL 1: Unexamined Japanese Patent Publication No. 2010-249751

SUMMARY OF THE INVENTION

According to the current detection circuit of PTL 1 described above, the output voltage of the operational amplifier is averaged and adjusted to a voltage that can be received by the microcomputer. Unfortunately, when there is a generated voltage that is averaged to a voltage exceeds an allowable voltage that can be received by the microcomputer, a resistance value of the shunt resistor is required to be reduced or an amplification factor of the operational amplifier is required to be reduced. When the shunt resistor is reduced in a resistance value or the operational amplifier is reduced in an amplification factor, accuracy of current detection for a current at a low level is reduced. Thus, when a current supplied to a motor ranges widely, there is a problem in that current detection accuracy in a low current range deteriorates.

The present invention is made in view of the above points, and an object of the present invention is to provide a ventilation device capable of improving current detection accuracy over the entire current range even for a current supplied to a motor, the current ranging widely.

To achieve the above object, a ventilation device according to the present invention includes a DC motor, a blade rotated by the DC motor, a current detector that detects a current value of a current flowing through the DC motor, a rotation speed detector that detects a rotation speed of the DC motor, and an air volume detector that calculates a air volume generated by the DC motor and the blade based on the current value detected by the current detector and the rotation speed detected by the rotation speed detector, the current detector including a shunt resistor that converts the current flowing through the DC motor into a voltage and outputs the voltage, a signal amplifying circuit that amplifies and outputs the voltage output from the shunt resistor, a current calculation circuit that receives the voltage output from the signal amplifying circuit, and at least one switch circuit that switch the voltage to be received by the current calculation circuit and that each include a switching element and a resistor that are connected in series, the current calculation circuit being configured to control the switching element based on a voltage value to be received, and calculate a current based on an operating state of each switching element and a voltage value received.

The ventilation device according to the present invention is capable of improving current detection accuracy over the entire current range even for a current supplied to a motor, the current ranging widely.

DESCRIPTION OF EMBODIMENTS

Figure 1:
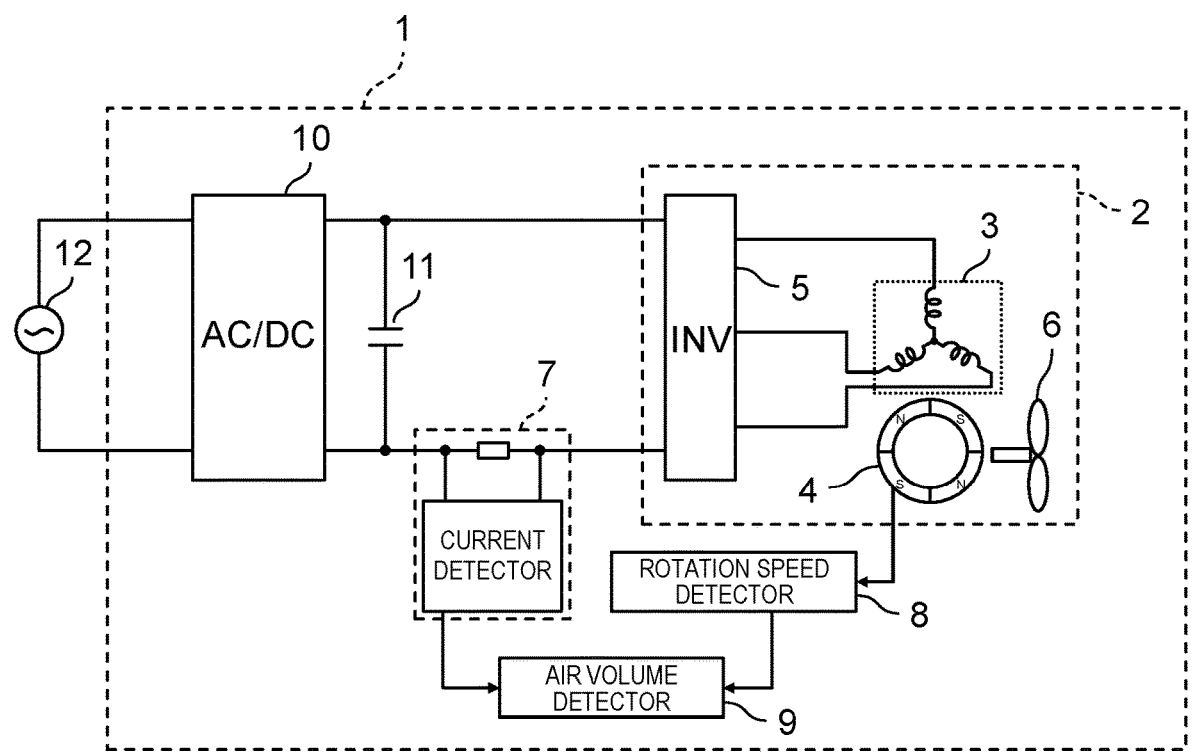
FIG. 1 is a functional block diagram of a ventilation device according to the present invention.

Hereinafter, exemplary embodiments of the present invention will be described with reference to the drawings. The following exemplary embodiments are each an example embodying the present invention, and do not limit the technical scope of the present invention. Throughout the drawings, the same parts are denoted by the same reference numerals, and duplicated description thereof is eliminated. For each of the drawings, detailed description of each part that is not directly related to the present invention is eliminated.

The exemplary embodiments are each described below with an example in which a brushless DC motor driven by inverter 5 is applied to DC motor 2 mounted on ventilation device 1. However, DC motor 2 of interest mounted on ventilation device 1 is not limited to the brushless DC motor driven by inverter 5, and another DC motor 2 may be mounted.

First Exemplary Embodiment

FIG. 1 is a diagram schematically illustrating a general configuration of ventilation device 1 according to the present exemplary embodiment. FIG. 1 illustrates a functional block of a part of ventilation device 1.

Ventilation device 1 includes AC/DC converter 10, smoothing capacitor 11, DC motor 2, current detector 7, rotation speed detector 8, and air volume detector 9.

AC/DC converter 10 rectifies AC voltage, which is supplied from commercial power supply 12, by full-wave rectification, and then supplies the AC voltage rectified to smoothing capacitor 11.

Smoothing capacitor 11 smooths the voltage supplied from AC/DC converter 10, converts the voltage into a DC voltage, and supplies the DC voltage to DC motor 2.

DC motor 2 includes inverter 5, stator 3, and rotor 4.

Inverter 5 adjusts the voltage by performing pulse width modulation (PWM) control on the DC voltage supplied from smoothing capacitor 11, and supplies the voltage to stator 3.

Stator 3 generates a rotating magnetic field when a current flows due to the voltage supplied from inverter 5.

Rotor 4 is provided with blade 6 attached and is provided on its side surface with a permanent magnet, for example, to be rotated by a rotating magnetic field generated by stator 3. Rotor 4 is rotated to rotate blade 6, thereby allowing ventilation device 1 to perform ventilation.

Current detector 7 is connected to DC motor 2 to detect a motor current flowing through DC motor 2, and then outputs a current value of the motor current to air volume detector 9. Details of current detector 7 will be described later.

Rotation speed detector 8 detects a rotation speed of DC motor 2, and outputs the rotation speed to air volume detector 9.

Air volume detector 9 detects a air volume generated by rotation of blade 6 attached to DC motor 2 based on the current value of DC motor 2 received from current detector 7 and the rotation speed of DC motor 2 received from rotation speed detector 8.

Ventilation device 1 can set the air volume to an appropriate value by adjusting the output of DC motor 2 based on the air volume detected by air volume detector 9.

Figure 2:
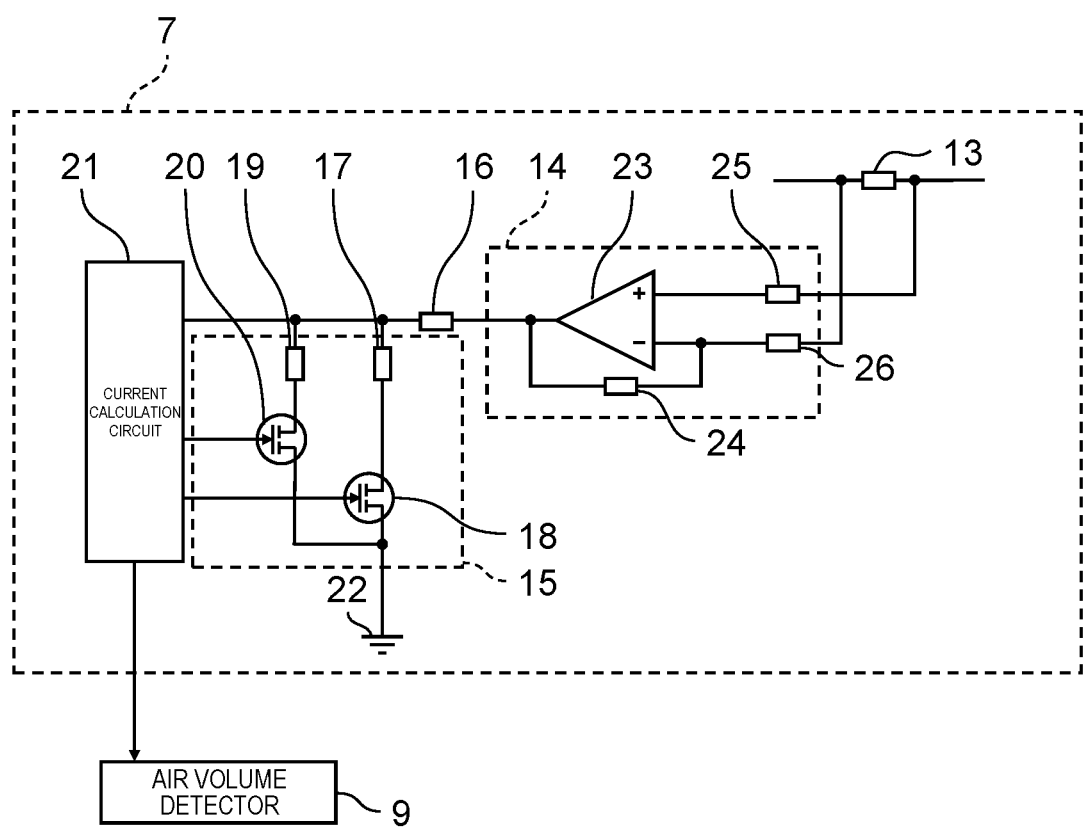
FIG. 2 is a diagram illustrating an example of a specific circuit configuration of a current detector including a voltage-dividing circuit.

FIG. 2 is a specific circuit configuration diagram of current detector 7 in the present exemplary embodiment. Current detector 7 includes shunt resistor 13, signal amplifying circuit 14, voltage-dividing circuit 15, input resistor 16, current calculation circuit 21, and ground 22.

Shunt resistor 13 is connected to DC motor 2 to convert a motor current flowing through DC motor 2 into a voltage, and outputs the voltage to signal amplifying circuit 14.

Signal amplifying circuit 14 includes operational amplifier 23, negative feedback resistor 24, input resistor A25, and input resistor B26. Signal amplifying circuit 14 is configured such that a non-inverting input terminal of operational amplifier 23 is connected to input resistor A25, an inverting input terminal of operational amplifier 23 is connected to input resistor B26, and negative feedback resistor 24 is connected between an output terminal and the inverting input terminal of operational amplifier 23. Signal amplifying circuit 14 is a non-inverting amplifier circuit that amplifies a voltage received from shunt resistor 13 with a predetermined amplification factor and outputs the amplified voltage to current calculation circuit 21.

Voltage-dividing circuit 15 includes voltage-dividing resistor A17, voltage-dividing resistor B19, switching element A18, and switching element B20. Although in the present embodiment, there is described two switch circuits in each of which not only voltage-dividing resistor A17 and switching element A18, but also voltage-dividing resistor B19 and switching element B20, are connected in series, any number of one or more switch circuits may be provided.

Input resistor 16 is connected in series between signal amplifying circuit 14 and current calculation circuit 21.

Voltage-dividing resistor A17 and switching element A18 are connected in series, and are connected between a node, which is between input resistor 16 and current calculation circuit 21, and ground 22.

Similarly, voltage-dividing resistor B19 and switching element B20 are connected in series, and are connected between a node, which is between input resistor 16 and current calculation circuit 21, and ground 22.

Switching elements A18 and B20 are switched between ON and OFF based on a signal received from current calculation circuit 21. When both switching elements A18 and B20 are OFF, current calculation circuit 21 receives a voltage equal to a voltage output from signal amplifying circuit 14. In contrast, when any one of switching elements A18 and B20 is ON or both are ON, current calculation circuit 21 receives a voltage divided by voltage-dividing resistor A17 or voltage-dividing resistor B19, the voltage having a voltage value lower than that of the voltage output from signal amplifying circuit 14.

Current calculation circuit 21 converts the voltage received into a digital signal, and this conversion is hereinafter referred to as AD conversion. Current calculation circuit 21 controls ON and OFF of switching elements A18 and B20 based on a value acquired by the AD conversion. Current calculation circuit 21 calculates a motor current flowing through DC motor 2 based on the value acquired by the AD conversion and a state whether each of switching elements A18 and B20 is ON or OFF, and then outputs a current value calculated to air volume detector 9.

Current detector 7 of the present exemplary embodiment has the configuration described above and operates as follows. There is described below an example of the operation above in which current calculation circuit 21 can receive a voltage value of 5 V at a maximum. The voltage value that can be received by current calculation circuit 21 means a voltage range in which current calculation circuit 21 can detect a detailed voltage value, the voltage range having a maximum value of 5 V. That is, current calculation circuit 21 stores 5 V as a predetermined voltage value.

Figure 3:
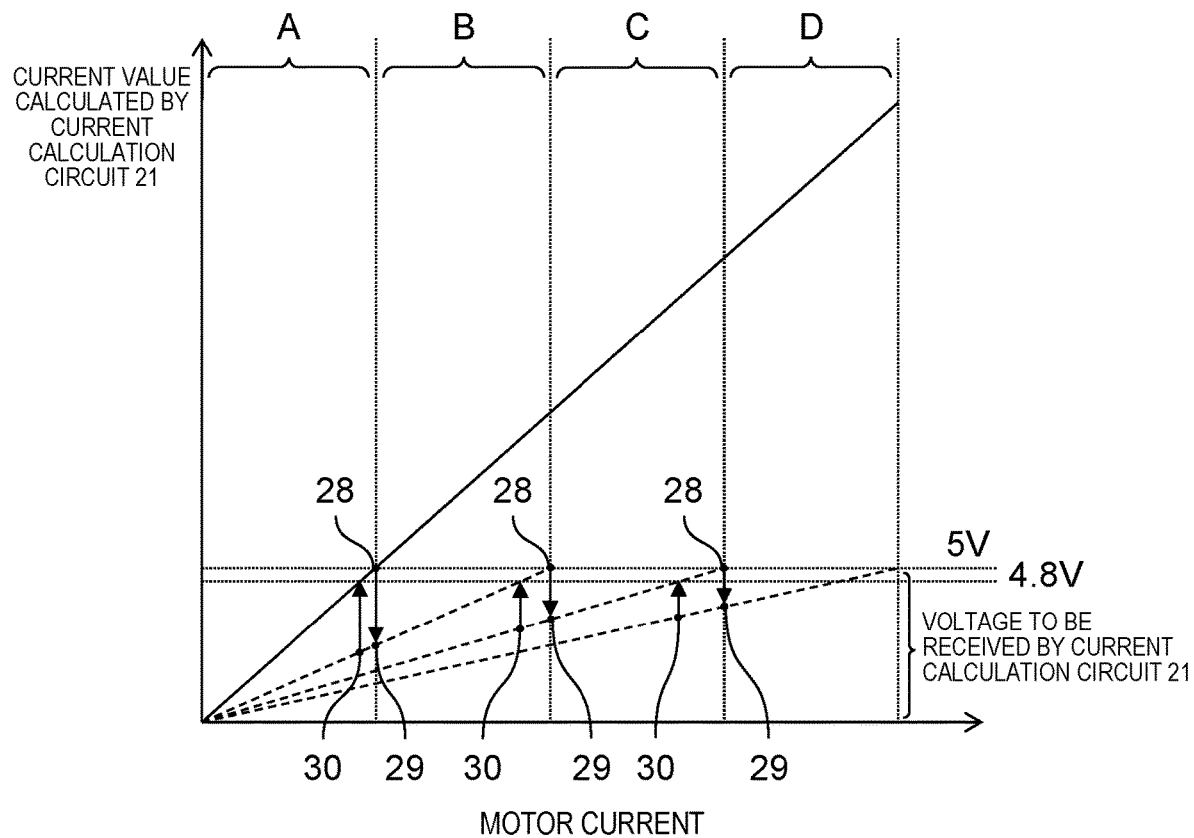
FIG. 3 is a diagram illustrating an example of current calculation in an example of the specific circuit configuration of the current detector.

First, control of switching elements A18 and B20 is described with reference to FIG. 3.

When a large motor current flows through DC motor 2 to cause current calculation circuit 21 to receive a voltage value reaching 5 V, current calculation circuit 21 switches ON and OFF of switching elements A18 and B20 to increase the amount of voltage drop in voltage-dividing circuit 15. Here, the amount of voltage drop in voltage-dividing circuit 15 is the amount of drop of a voltage value that is lowered by voltage-dividing circuit 15 and to be received by current calculation circuit 21. The switching above allows the voltage value, which is to be received by current calculation circuit 21, to decrease to smaller than 5 V due to increase in the amount of voltage drop in voltage-dividing circuit 15. That is, current calculation circuit 21 constituting current detector 7 stores a predetermined voltage value (5 V) as switching voltage value α28 for switching the switching element to increase the amount of voltage drop in voltage-dividing circuit 15, and controls the switching element so that current calculation circuit 21 receives a voltage value of less than or equal to the predetermined voltage value (5 V).

In contrast, when a small motor current flows through DC motor 2 to cause current calculation circuit 21 to receive a voltage value less than switching voltage value β29, current calculation circuit 21 switches ON and OFF of switching elements A18 and B20 to reduce the amount of voltage drop in voltage-dividing circuit 15. Here, switching voltage value β29 allows current calculation circuit 21 to receive the predetermined voltage value (5 V) after the switching. As a result, current calculation circuit 21 receives a voltage value higher than that before the switching due to decrease in the amount of voltage drop in voltage-dividing circuit 15 while the voltage value is kept less than or equal to the predetermined voltage value (5 V), so that accuracy of a current value calculated by current calculation circuit 21 can be improved. At this time, switching voltage value β29 may be provided with hysteresis for switching stabilization.

Here, the hysteresis specifically means that a switching voltage value for switching the switching element to reduce the amount of voltage drop in voltage-dividing circuit 15 is set to switching voltage value γ30 that allows a voltage, which is to be received by current calculation circuit 21 after the switching, to have a voltage value smaller than the predetermined voltage value (5 V). For example, a voltage value allowing current calculation circuit 21 to receive a voltage value of 4.8 V after the switching is set as switching voltage value γ30, and is provided with a difference from switching voltage value β29.

Subsequently, operation of current calculation circuit 21 to calculate a motor current flowing through DC motor 2 will be described with reference to FIG. 3. There is described below an example of the operation above in which voltage-dividing resistor A17 has a higher resistance value than voltage-dividing resistor B19.

When both switching elements A18 and B20 are OFF (range of A), current calculation circuit 21 receives a voltage equal to a voltage output from signal amplifying circuit 14. At this time, current calculation circuit 21 calculates a motor current flowing through DC motor 2 based on a value obtained by performing AD conversion on the voltage value received.

When switching element A18 is ON and switching element B20 is OFF (range of B), current calculation circuit 21 receives a voltage divided by voltage-dividing resistor A17, the voltage being lower than a voltage output from signal amplifying circuit 14. At this time, current calculation circuit 21 calculates a motor current flowing through DC motor 2 based on a value obtained by dividing a value, which is acquired by converting the received voltage value by the AD conversion, by a voltage drop rate achieved by voltage-dividing resistor A17.

When switching element A18 is OFF and switching element B20 is ON (range of C), current calculation circuit 21 receives a voltage divided by voltage-dividing resistor B19, the voltage being lower than the voltage output from signal amplifying circuit 14. At this time, the amount of drop of voltage divided by voltage-dividing resistor B19 is larger than the amount of voltage drop in the range of B, and current calculation circuit 21 calculates a motor current flowing through DC motor 2 based on a value obtained by dividing the value, which is acquired by converting the received voltage value by the AD conversion, by a voltage drop rate achieved by voltage-dividing resistor B19.

When both switching elements A18 and B20 are ON (range of D), current calculation circuit 21 receives a voltage divided by voltage-dividing resistors A17 and B19, the voltage being lower than the voltage output from signal amplifying circuit 14. At this time, the amount of drop of voltage divided by voltage-dividing resistors A17 and B19 is larger than the amount of voltage drop in the range of B or the range of C, and current calculation circuit 21 calculates a motor current flowing through DC motor 2 based on a value obtained by dividing the value, which is acquired by converting the received voltage value by the AD conversion, by a voltage drop rate achieved by voltage-dividing resistors A17 and B19.

As described above, the above exemplary embodiment enables adjusting a voltage to be received by current calculation circuit 21 to a voltage value that can be received thereby, or to a voltage range in which a detailed voltage value can be detected by current calculation circuit 21, by controlling switching elements A18 and B20 of voltage-dividing circuit 15 in accordance with the voltage output from signal amplifying circuit 14. Thus, current calculation circuit 21 can widen a range of a current that can be calculated (detected) without deterioration in accuracy. Air volume detector 9 accordingly can widen a range in which a air volume generated by ventilation device 1 can be accurately calculated.

Current calculation circuit 21 performs the control of the switching elements described above by controlling a voltage value, which is to be received by current calculation circuit 21, to sequentially increase or reduce the voltage value while detecting the voltage value to be received thereby. Specifically, it is assumed that the voltage value to be received is 5 V or more even when switching elements A18 and B20 in an OFF state (range A) are transitioned to a state (range B) where switching elements A18 is ON and switching element B20 is OFF. In this case, the amount of voltage drop is sequentially increased, or the state above is transitioned to a state (range of C) where switching element A18 is OFF and switching element B20 is ON, and is further transitioned to a state (range of D) where switching elements A18 and B20 are ON, as necessary.

The above is a procedure in which voltage-dividing circuit 15 sequentially reduces the voltage value from 5 V that is a maximum voltage value that can be received by current calculation circuit 21. When the voltage value is sequentially increased from a voltage less than switching voltage value β29, the switching elements may be controlled to reduce the amount of voltage drop from the range of D.

This configuration enables detecting a current value over a wide range with high accuracy in accordance with the number of switch circuits.

When hysteresis is provided to a voltage threshold for switching the switching elements to reduce the amount of voltage drop in voltage-dividing circuit 15, calculation (detection) of a current is stabilized even when disturbance such as noise occurs.

For example, it is assumed that a voltage to be received by current calculation circuit 21 fluctuates around the predetermined voltage value (5 V) due to influence of noise. In this case, when the voltage to be received by current calculation circuit 21 reaches switching voltage value α28, or the predetermined voltage value (5 V), current calculation circuit 21 switches the switching elements to adjust the voltage to be received to switching voltage value β29. However, current calculation circuit 21 receives a voltage less than switching voltage value β29 immediately after the switching due to the influence of noise, so that the switching elements are required to be switched to the state before the switching again. Then, this control frequently occurs to cause unstable detection of a current. For this problem, hysteresis is provided, or the voltage threshold for switching the switching elements to reduce the amount of voltage drop in voltage-dividing circuit 15 is set as switching voltage value γ30 in advance. This case does not require the switching elements to be frequently switched even when current calculation circuit 21 receives a voltage less than switching voltage value β29 due to the influence of noise in the assumption described above, because there is a difference between switching voltage value β29 and switching voltage value γ30, and thus stabilizing the calculation (detection) of a current of current calculation circuit 21.

Second Exemplary Embodiment

Figure 4:
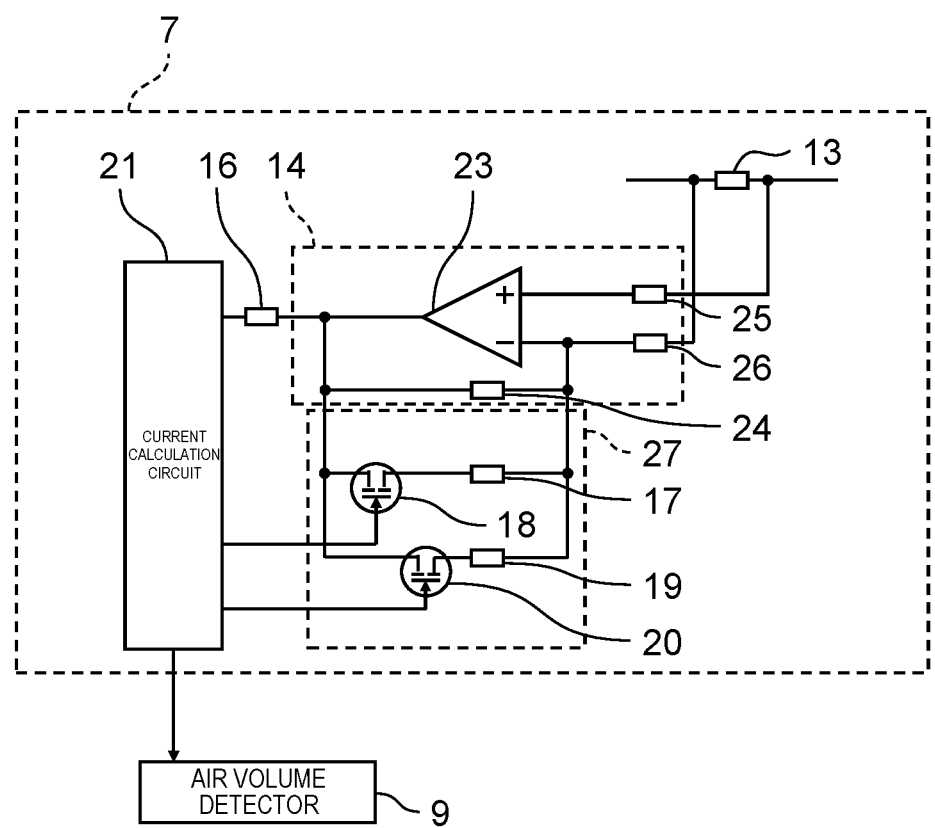
FIG. 4 is a diagram illustrating an example of a specific circuit configuration of a current detector including an amplification factor adjusting circuit.
Figure 5:
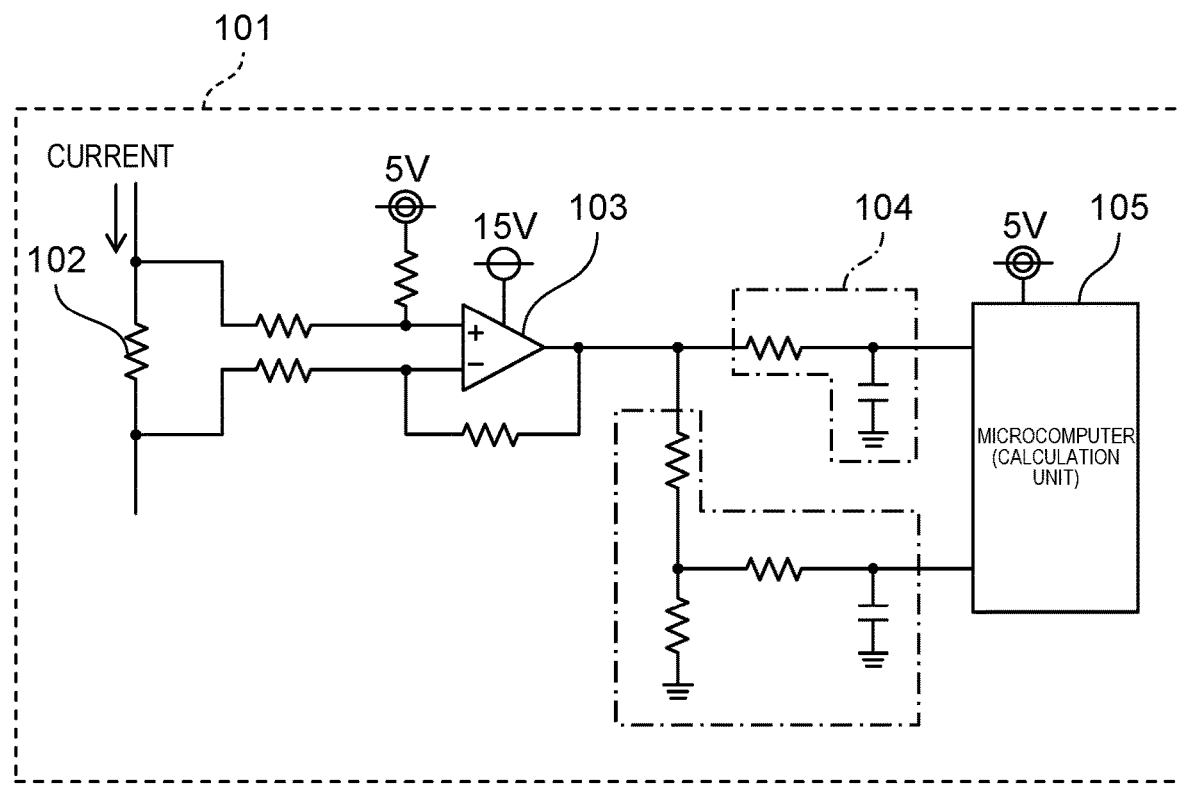
FIG. 5 is a diagram illustrating a current detection circuit according to a conventional technique.

FIG. 4 illustrates a specific configuration of another current detector 7 different from that of the first exemplary embodiment. This is a specific circuit when the switch circuits constituting voltage-dividing circuit 15 in the first exemplary embodiment are connected in parallel to negative feedback resistor 24 in the second exemplary embodiment to be configured as amplification factor adjusting circuit 27. In FIG. 4, a component similar to that in FIG. 2 is denoted by the same reference mark, and detailed description thereof will be eliminated.

Switching elements A18 and B20 are switched between ON and OFF based on a signal received from current calculation circuit 21. When both switching elements A18 and B20 are OFF, an amplification factor of signal amplifying circuit 14 is determined by resistance values of negative feedback resistor 24 and input resistor B26. In contrast, when any one of switching elements A18 and B20 is ON or both are ON, a resistance value between the output terminal and the inverting input terminal of operational amplifier 23 is divided by voltage-dividing resistor A17 or B19, and then is reduced to lower than the resistance value of negative feedback resistor 24. Thus, signal amplifying circuit 14 has an amplification factor lower than that when both switching elements A18 and B20 are OFF.

Current detector 7 of the present exemplary embodiment has the configuration described above and operates as follows. There is described below an example of the operation above in which current calculation circuit 21 can receive a voltage value of 5 V at a maximum as with the first exemplary embodiment.

First, control of switching elements A18 and B20 is described with reference to FIG. 3.

When a large motor current flows through DC motor 2 to cause current calculation circuit 21 to receive a voltage value reaching 5 V, current calculation circuit 21 switches ON and OFF of switching elements A18 and B20 to reduce the amplification factor of signal amplifying circuit 14. The switching above allows the voltage value, which is to be received by current calculation circuit 21, to decrease to smaller than 5 V due to decrease in the amplification factor of signal amplifying circuit 14. That is, current calculation circuit 21 constituting current detector 7 stores a predetermined voltage value (5 V) as switching voltage value α28 for switching the switching element to reduce the amplification factor of signal amplifying circuit 14, and controls the switching element so that current calculation circuit 21 receives a voltage value of less than or equal to the predetermined voltage value (5 V).

In contrast, when a small motor current flows through DC motor 2 to cause current calculation circuit 21 to receive a voltage value less than switching voltage value β29, current calculation circuit 21 switches ON and OFF of switching elements A18 and B20 to increase the amplification factor of signal amplifying circuit 14. As a result, current calculation circuit 21 receives a voltage value higher than that before the switching due to increase in the amplification factor of signal amplifying circuit 14 while the voltage value is kept less than or equal to the predetermined voltage value (5 V), so that accuracy of a current value calculated by current calculation circuit 21 can be improved. As with the first exemplary embodiment, hysteresis for switching stabilization may be provided to switching voltage value β29 at the time of switching the switching elements.

Subsequently, operation of current calculation circuit 21 to calculate a motor current flowing through DC motor 2 will be described with reference to FIG. 3. There is described below an example of the operation above in which voltage-dividing resistor A17 has a higher resistance value than voltage-dividing resistor B19.

When both switching elements A18 and B20 are OFF (range of A), the amplification factor of signal amplifying circuit 14 is determined by resistance values of negative feedback resistor 24 and input resistor B26. At this time, current calculation circuit 21 calculates a motor current flowing through DC motor 2 based on a value obtained by performing AD conversion on the voltage value received.

When switching element A18 is ON and switching element B20 is OFF (range of B), the resistance value between the output terminal and the inverting input terminal of operational amplifier 23 is divided by voltage-dividing resistor A17, so that the amplification factor of signal amplifying circuit 14 decreases as compared with that in the range of A. At this time, current calculation circuit 21 calculates a motor current flowing through DC motor 2 based on a value obtained by dividing a value, which is obtained by performing AD conversion on the voltage value received, by a ratio of the amplification factor having decreased to that in the range of A.

When switching element A18 is OFF and switching element B20 is ON (range of C), the resistance value between the output terminal and the inverting input terminal of operational amplifier 23 is divided by voltage-dividing resistor B19, so that the amplification factor of signal amplifying circuit 14 decreases as compared with that in the range of B. At this time, current calculation circuit 21 calculates a motor current flowing through DC motor 2 based on a value obtained by dividing a value, which is obtained by performing AD conversion on the voltage value received, by a ratio of the amplification factor having decreased to that in the range of A.

When both switching elements A18 and B20 are ON (range of D), the resistance value between the output terminal and the inverting input terminal of operational amplifier 23 is divided by voltage-dividing resistors A17 and B19, so that the amplification factor of signal amplifying circuit 14 decreases as compared with that in the range of C. At this time, current calculation circuit 21 calculates a motor current flowing through DC motor 2 based on a value obtained by dividing a value, which is obtained by performing AD conversion on the voltage value received, by a ratio of the amplification factor having decreased to that in the range of A.

As described above, the above exemplary embodiment enables adjusting a voltage to be received by current calculation circuit 21 to a voltage value that can be received thereby, or to a voltage range in which a detailed voltage value can be detected by current calculation circuit 21, by controlling switching elements A18 and B20 of amplification factor adjusting circuit 27 in accordance with the voltage output from signal amplifying circuit 14. Thus, current calculation circuit 21 can widen a range of a current that can be calculated (detected) without deterioration in accuracy. Air volume detector 9 accordingly can widen a range in which a air volume generated by ventilation device 1 can be accurately calculated, and thus the above configuration also has an effect equivalent to that of the first exemplary embodiment.

As with the first exemplary embodiment, current calculation circuit 21 may perform the control of the switching elements described above by controlling a voltage value, which is to be received by current calculation circuit 21, to sequentially increase or reduce the voltage value while detecting the voltage value to be received thereby. In the control, the second exemplary embodiment is different in that amplification factor adjusting circuit 27 is used instead of voltage-dividing circuit 15.

INDUSTRIAL APPLICABILITY

The ventilation device according to the present invention can improve detection accuracy of a motor current without being limited to a use range of a motor current flowing through a DC motor, and thus is useful as a ventilation device capable of controlling a air volume with high accuracy over a wide range.

REFERENCE MARKS IN THE DRAWINGS 1 ventilation device
2 DC motor
3 stator
4 rotor
5 inverter
6 blade
7 current detector
8 rotation speed detector
9 air volume detector
10 AC/DC converter
11 smoothing capacitor
12 commercial power supply
13 shunt resistor
14 signal amplifying circuit
15 voltage-dividing circuit
16 input resistor
17 voltage-dividing resistor A
18 switching element A
19 voltage-dividing resistor B
20 switching element B
21 current calculation circuit
22 ground
23 operational amplifier
24 negative feedback resistor
25 input resistor A
26 input resistor B
27 amplification factor adjusting circuit
28 switching voltage value α
29 switching voltage value β
30 switching voltage value γ
101 current detection circuit
102 shunt resistor
103 operational amplifier
104 averaging circuit
105 microcomputer

The invention claimed is:

1. A ventilation device comprising:
a DC motor;
a blade rotated by the DC motor;
a current detector that detects a current value of a current flowing through the DC motor;
a rotation speed detector that detects a rotation speed of the DC motor; and
an air volume detector that calculates a air volume generated by the blade based on the current value detected by the current detector and the rotation speed detected by the rotation speed detector, wherein
the current detector includes
a shunt resistor that converts the current flowing through the DC motor into a voltage and outputs the voltage,
a signal amplifying circuit that amplifies the voltage output from the shunt resistor at a predetermined amplification factor and outputs the voltage amplified,
a voltage-dividing circuit that divides the voltage output from the signal amplifying circuit, and
a current calculation circuit that receives the voltage divided by the voltage-dividing circuit,
the voltage-dividing circuit includes
at least one switch circuit each including a switching element and a resistor that are connected in series, and
the current calculation circuit is configured to control the switching element of the voltage-dividing circuit based on a voltage value divided by the voltage-dividing circuit, and calculate a current flowing through the DC motor based on an operating state of the switching element and the voltage value received by the current calculation circuit.

2. A ventilation device comprising:
a DC motor;
a blade rotated by the DC motor;
a current detector that detects a current flowing through the DC motor;
a rotation speed detector that detects a rotation speed of the DC motor; and
an air volume detector that calculates a air volume generated by the blade based on a current value detected by the current detector and the rotation speed detected by the rotation speed detector,
wherein the current detector includes
a shunt resistor that converts the current flowing through the DC motor into a voltage and outputs the voltage,
a signal amplifying circuit that amplifies and outputs the voltage output from the shunt resistor,
an amplification factor adjusting circuit that adjusts an amplification factor used by the signal amplifying circuit, and
a current calculation circuit that receives the voltage adjusted by the amplification factor adjusting circuit,
the signal amplifying circuit includes
an operational amplifier that receives the voltage output from the shunt resistor, and
a negative feedback resistor that is connected between an input terminal and an output terminal of the operational amplifier,
the amplification factor adjusting circuit includes at least one switch circuit connected in parallel to the negative feedback resistor, the at least one switch circuit each including a switching element and a resistor that are connected in series, and
the current calculation circuit is configured to control the switching element based on a voltage value adjusted by the amplification factor adjusting circuit, and calculate a current flowing through the DC motor based on an operating state of the switching element and the voltage value received.

3. The ventilation device according to claim 1, wherein the current detector controls the switching element to receive a voltage value less than or equal to a predetermined voltage value.

4. The ventilation device according to claim 3, wherein the predetermined voltage value is a maximum voltage value that is allowed to be received by the current calculation circuit.

5. The ventilation device according to claim 1, wherein
the current calculation circuit compares a predetermined voltage value with a voltage value to be received when calculating a current flowing through the DC motor, and
when the voltage value to be received is more than or equal to the predetermined voltage value, the current calculation circuit controls the switching element to increase an amount of voltage drop caused by the voltage-dividing circuit.

6. The ventilation device according to claim 5, wherein
the at least one switch circuit includes a plurality of switch circuits, and
the current calculation circuit controls the switching element included in each of the plurality of switch circuits to sequentially increase the amount of voltage drop when the voltage value to be received is more than or equal to the predetermined voltage value.

7. The ventilation device according to claim 1, wherein
the current calculation circuit compares a switching voltage value with a voltage value to be received when calculating a current flowing through the DC motor, and
when the voltage value to be received is less than the switching voltage value, the current calculation circuit controls the switching element to reduce an amount of voltage drop caused by the voltage-dividing circuit.

8. The ventilation device according to claim 7, wherein
the at least one switch circuit includes a plurality of switch circuits, and
the current calculation circuit controls the switching element included in each of the plurality of switch circuits to sequentially reduce the amount of voltage drop when the voltage value to be received is less than the switching voltage value.

9. The ventilation device according to claim 2, wherein
the current calculation circuit compares a predetermined voltage value with a voltage value to be received when calculating a current flowing through the DC motor, and
when the voltage value to be received is more than or equal to the predetermined voltage value, the current calculation circuit controls the switching element to reduce an amplification factor of the signal amplifying circuit.

10. The ventilation device according to claim 9, wherein
the at least one switch circuit comprises a plurality of switch circuits, and
the current calculation circuit controls the switching element included in each of the plurality of switch circuits to sequentially reduce the amplification factor of the signal amplifying circuit when the voltage value to be received is more than or equal to the predetermined voltage value.

11. The ventilation device according to claim 2, wherein
the current calculation circuit compares a switching voltage value with a voltage value to be received when calculating a current flowing through the DC motor, and
when the voltage value to be received is less than the switching voltage value, the current calculation circuit controls the switching element to increase the amplification factor of the signal amplifying circuit.

12. The ventilation device according to claim 11, wherein
the at least one switch circuit includes a plurality of switch circuits, and
the current calculation circuit controls the switching element included in each of the plurality of switch circuits to sequentially increase the amplification factor of the signal amplifying circuit when the voltage value to be received is less than the switching voltage value.

13. The ventilation device according to claim 7, wherein the current detector uses the switching voltage value provided with hysteresis.

14. The ventilation device according to claim 2, wherein the current detector controls the switching element to receive a voltage value less than or equal to a predetermined voltage value.

15. The ventilation device according to claim 14, wherein the predetermined voltage value is a maximum voltage value that is allowed to be received by the current calculation circuit.

16. The ventilation device according to claim 11, wherein the current detector uses the switching voltage value provided with hysteresis.

* * * * *